United States Patent [19]
Seki et al.

[11] Patent Number: 5,238,524
[45] Date of Patent: Aug. 24, 1993

[54] HOLE MASKING APPARATUS

[75] Inventors: Kameharu Seki; Yasuaki Otani; Isamu Kubo, all of Saitama, Japan

[73] Assignee: Nippon CMK Corp., Japan

[21] Appl. No.: 794,442

[22] Filed: Nov. 19, 1991

[30] Foreign Application Priority Data

Nov. 19, 1990 [JP] Japan .................................. 2-313089

[51] Int. Cl.⁵ .............................................. B32B 31/00
[52] U.S. Cl. ..................................... 156/538; 156/540; 156/542; 156/556; 118/213; 271/186
[58] Field of Search ................ 156/552, 540, 541, 542, 156/238, 538, 556; 118/213; 271/186, 187

[56] References Cited
U.S. PATENT DOCUMENTS

| | | | |
|---|---|---|---|
| 4,287,016 | 9/1981 | Kerwin et al. | 156/542 X |
| 4,379,017 | 4/1983 | Barta | 156/238 |
| 4,519,760 | 5/1985 | Norell | 118/213 X |
| 5,090,680 | 2/1992 | Yashiro | 271/187 X |

*Primary Examiner*—David A. Simmons
*Assistant Examiner*—James J. Engel, Jr.
*Attorney, Agent, or Firm*—Bruce L. Adams; Van C. Wilks

[57] ABSTRACT

A hole masking apparatus for use in the manufacture of a printed wiring board is disclosed. The apparatus comprises first and second positioning sections provided on a conveying path of a base material at a distance apart for stopping the positioning of the base material having a plurality of through holes at respective given position; a masking device provided to respective positioning sections and having a head to paste a seal while supplying and for pasting the seal on through holes by moving the head in such a manner that the head is positioned on through holes which do not require a plugging up thereof; and a reversing section arranged between the first and the second positioning sections and for reversing face and back of the base material on the conveying path thereof.

5 Claims, 6 Drawing Sheets

HOLE MASKING APPARATUS

BACKGROUND OF THE INVENTION

The present invention relates to a hole masking apparatus for masking a through hole perforated in a base plate or material by applying or pasting a seal on the through hole.

During the process of manufacturing a printed wiring board, the step of plugging through holes perforated in a base material of the printed wiring board with a conductive filling material is generally performed by a step of first filling the through holes over the whole surface of the base material by a silk screen method. In this case, before the step of filling with the conductive material over the whole surface of the base material, a masking work is required, by which the open portions of all of the through holes which do not require filling, such as, for example, component attaching holes and the like, are masked.

FIG. 7 shows such a masking work. A base plate or material 10 comprises a plurality of through holes 11 and 12. The through hole 11, for example, is a through hole which is not to be plugged or filled with the conducting material, and the through hole 12 is a through hole which does not need to be plugged or filled. In this case, masking is performed by pasting a seal 13 on the opening portion of the through hole 12.

The reference numeral 14 designates dummy through holes perforated in the base material 10 at opposing positions at the outer periphery side for obtaining a reference position of the base material during various steps of the process of manufacturing a printed wiring board. As shown in FIG. 8, the masking for the through hole 12 which does not require plugging is performed by pasting a seal 13 on both of the opening end portions of the through hole 12. In a conventional process, this pasting of the seal 13 is performed by manual workings.

In FIG. 8, the reference numeral 15 designates a conductive layer formed on one surface of the base material 10.

The conventional masking operation, however, can not eliminate or reduce labor costs because of its manual workings in the conveying of the base material, and it is often necessary to complicate workings further, such as by having to mark the through holes which require masking, and manually cutting and pasting the seal, resulting in a less workable process. Particularly, the masking operation requires pasting a seal onto both surfaces of the base material for a particular through hole, and the aforementioned operations must be repeated so that the efficiency is reduced and production times increase.

SUMMARY OF THE INVENTION

It is an object of the present invention to overcome the above described disadvantages of the conventional hole masking apparatus and process.

It is another object of the present invention to provide a hole masking apparatus for automatically performing masking by applying or pasting a seal onto the open end of a through hole.

It is a further object of the present invention to provide a hole masking apparatus in which the pasting of the seal onto through holes which do not require plugging is performed automatically, advantageously providing the elimination or reduction of labor and unnecessary manual operations, and providing an effective process.

According to the present invention, there is provided a hole masking apparatus comprising first and second positioning sections provided on a path along which a base material is conveyed, the positioning sections being arranged apart from each other and along the conveying path. Each of the positioning sections is for stopping and positioning a base material having a plurality of through holes at respective given positions. A masking device is provided at each of the respective positioning sections, each masking device having a head for pasting a seal onto and thereby masking through holes, for supplying seals to be pasted, and for moving the head in such a manner that the head is positioned for pasting seals onto through holes which do not require plugging. A reversing section is arranged along the conveying path and between the first and the second positioning sections for reversing the face and back of the base material on the conveying path by flipping the material through a vertical arc.

The conveying path of the base material is provided at the downstream side of the respective positioning sections with a pressure roller movable to and engageable with the base material surface to which seals have been pasted.

The first and the second positioning sections comprise a stopper pin for engaging and touching the forward end surface of the base material in the conveyed direction and a lock pin capable of being inserted detachable into dummy holes in the base material.

The head of the masking device comprises a supply means for, on the one hand, supplying a tape having a plurality of seals sandwiched between peeling papers at given pitches and, on the other hand, peeling one of the peeling papers. The head also comprises a hammer for pasting the seal onto the base material by pressing on a seal on the tape, for which one of the papers has been peeled off by the supply means, onto the base material.

The reversed section has a plurality of engaging pawls, each having slits, and into which the forward end portion of the base material is inserted. Rotation of the pawls enables reversing the respective face and back sides of the base material. The engaging pawl is rotated in the same direction as the direction in which the base material is conveyed.

According to the hole masking apparatus of the present invention, the masking device at the first positioning section operates on one surface of the base material which has been positioned by the first positioning section, and pastes seals to mask the through holes which do not require plugging. The base material is then flipped over, and positioned and stopped at the second positioning section where the masking device at the second positioning section is operated likewise to paste a seal onto the opposite surface of the base material. In this manner, the masking work for pasting seals onto the base material is performed by the present apparatus.

DETAILED EXPLANATION OF THE PREFERRED EMBODIMENT

Figure 1:
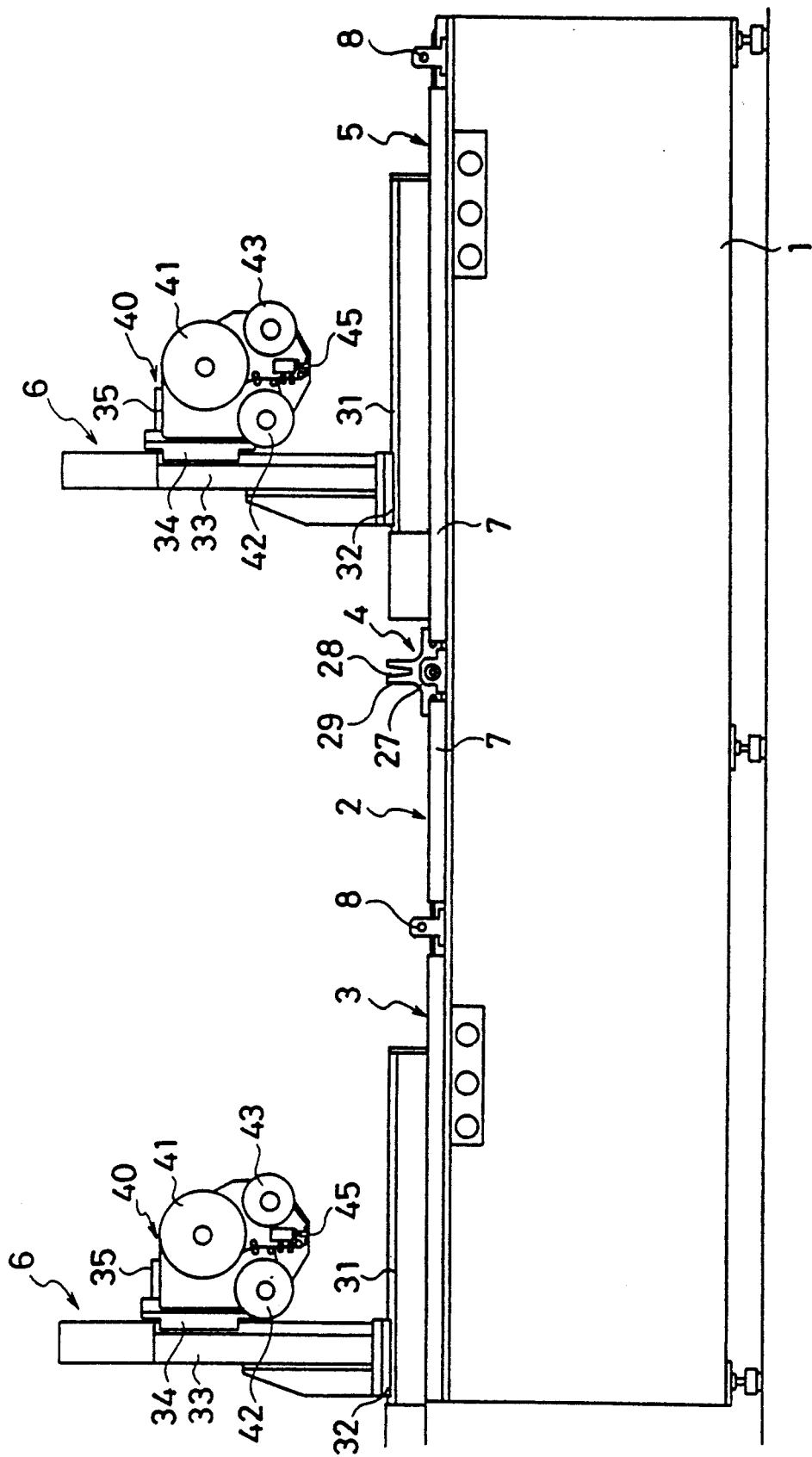
FIG. 1 is a side view showing one embodiment of a hole masking apparatus to the present invention.

With reference again to the drawings, there is shown an embodiment of a hole masking apparatus according to the present invention. Like parts are shown by corresponding reference characters throughout the several views of the drawings.

Figure 2:
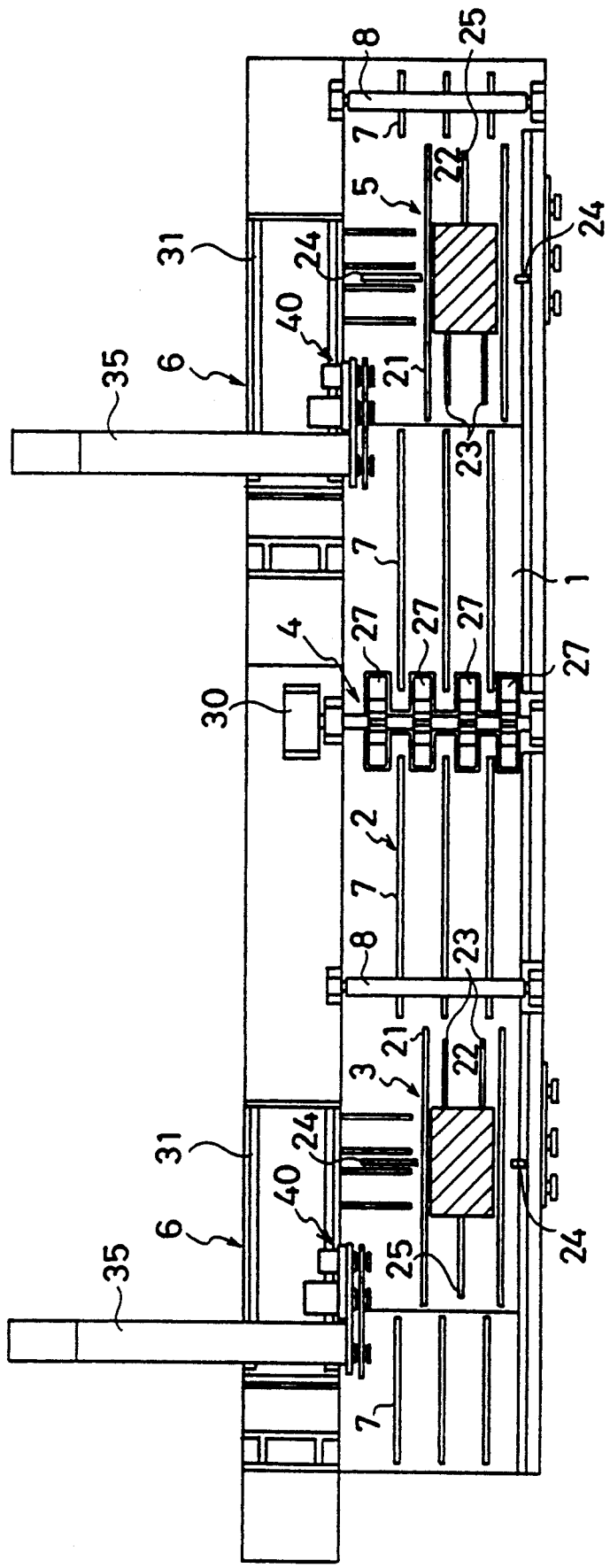
FIG. 2 is a plan view showing one embodiment of a hole masking apparatus according to the present invention.

FIGS. 1 and 2 show the construction of one embodiment of a hole masking apparatus according to the present invention. A conveying path 2 is provided on a platform 1, the horizontal position of which can be adjusted. Along this conveying path 2, a first positioning section 3, a reversing section 4 and a second positioning section 5 are arranged. The first and the second positioning sections 3 and 5 are each provided with a masking device 6. The conveying path 2 is provided by continuously moving a given length of conveyor 7 in the longitudinal direction of the conveying path, whereby base material 10 input to the conveying path 2 is conveyed to the first positioning section 3, then to the reversing section 4, and finally to the second positioning section 5, in that order. Provided downstream from both the first positioning section 3 and the second positioning section 5 are pressure rollers 8,8, respectively, which exert pressure on the surface of the base material 10 which has just been processed at each of the respective positioning sections 3,5. The first positioning section 3 and the second positioning section 5 control the conveyance of the base material 10 to stop a desired section of the base material at their respective position.

Figure 3:
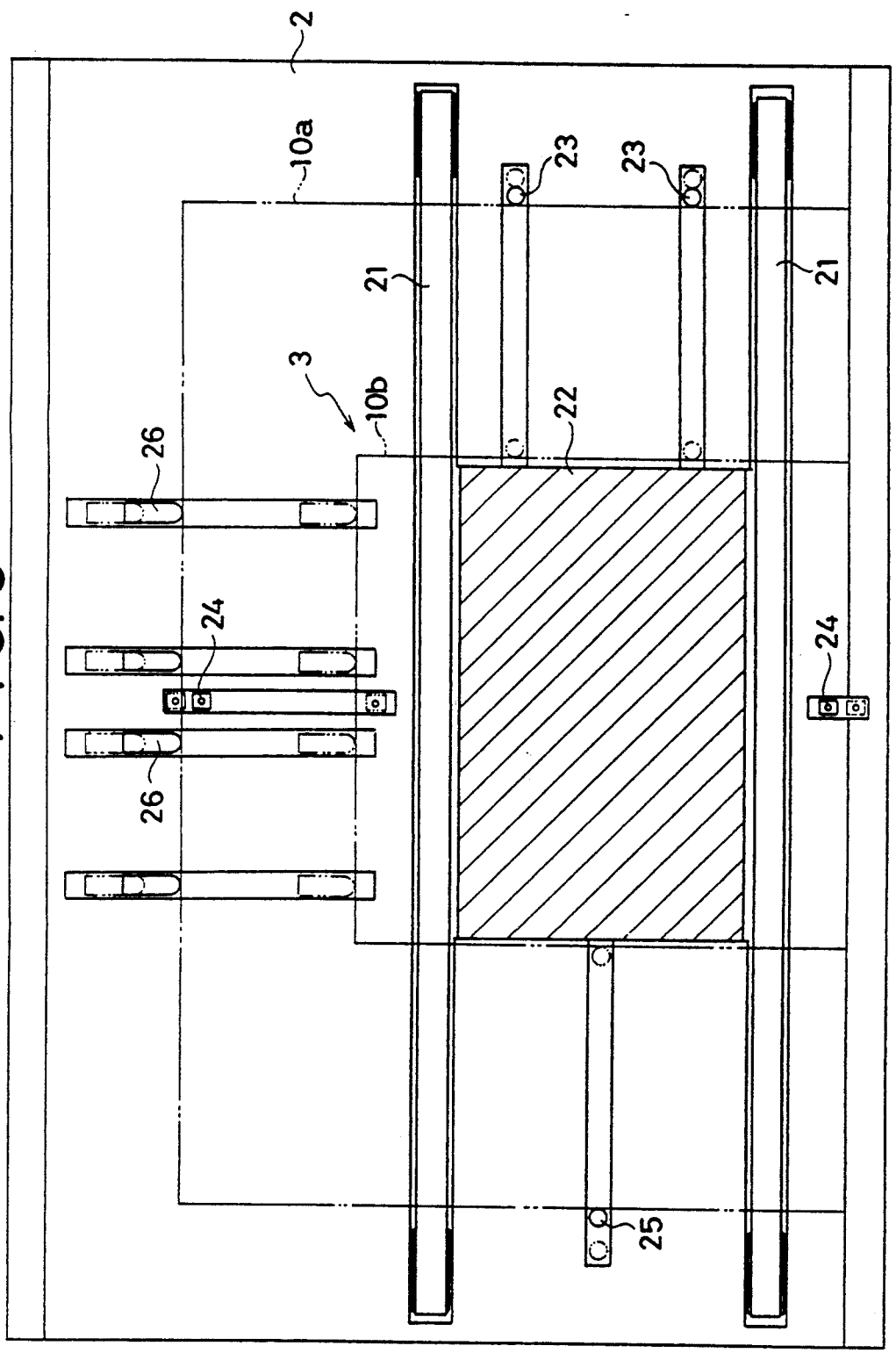
FIG. 3 is a plan view showing positioning sections for use in a hole masking apparatus according to the present invention.

FIG. 3 shows the first positioning section 3 in detail which, more particularly, comprises a pair of belt conveyers 21 arranged along the conveying path 2 and positioned between sections of the conveyers 7, a vacuum table 22 provided between the belt conveyers 21 for sucking on to and fixing the base material 10 by way of a vacuum force, a pair of stopper pins 23 provided so as to be movable in and out of the plane of the platform 1 at the downstream side of the vacuum table 22, and lock pins 24 provided so as to be movable in and out of the plane of the platform 1 at both sides of the belt conveyer 21.

Figure 7:
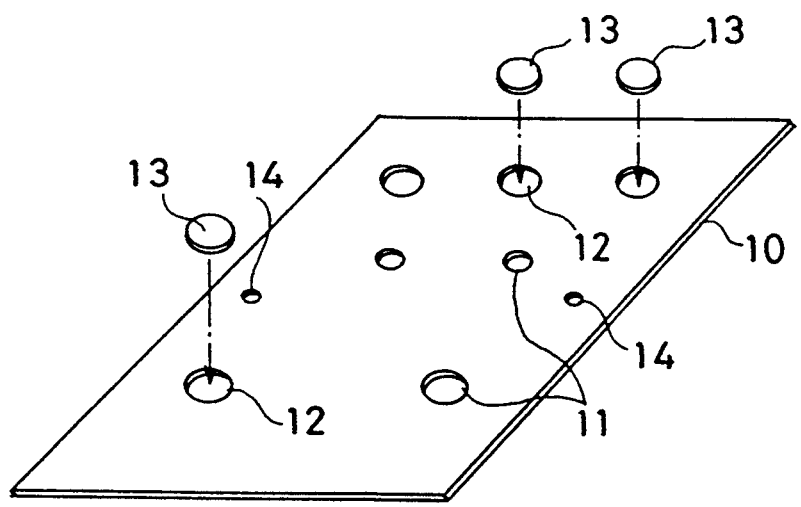
FIG. 7 is a perspective view showing the base material for use with a hole masking apparatus according to the present invention.
Figure 8:
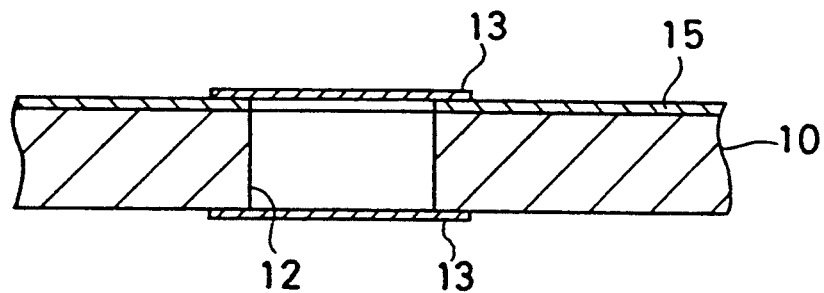
FIG. 8 is a partially sectional view of the base material shown in FIG. 7.

The stopper pin 23 serves to halt conveyance of the base material 10 and for positioning the base material 10 along the conveying direction by touching it at the front end surface thereof with respect to the conveying direction. The lock pins 24 are for positioning of the base material 10 in the transverse direction with respect to the conveying path by projecting likewise into and out of the platform. When a section of the base material 10 is positioned and stopped by the stopper pin 23, lock pin 24 projects out of the platform and enters a dummy hole 14 (FIG. 7) provided in the base material. The stopper pin 23 and the lock pin 24 can be adjusted to accommodate base materials 10 of various sizes and thus can be slid and moved, respectively, with respect to the platform 1 as shown in FIG. 3 by a chain line. This sliding and moving can perform the positioning of the base material with a relative size range as indicated by 10a and 10b.

While the base material 10 is abutting the stopper pin 23, a butt pin 25 is provided so as to slide and move in the conveying direction to abut the upstream side of the base material adjacent the vacuum table 22. The belt conveyer 21 is provided at one side thereof with a plurality of sizing heads 26. The sizing head 26 slides and moves in the direction orthogonal to the conveying direction of the base material, so as to abut the base material and perform the positional registration in cooperation with the lock pin 24 in the transverse direction.

The second positioning section 5 has substantially the same construction as the first positioning section 3, so that the parts corresponding to ones shown in FIG. 3 will be designated by their corresponding reference characters. The stopper pin 23 and the butt pin 25 of the second positioning section 5 are provided symmetrically to those of the first positioning section 3 with respect to reversing section 4. That is, at the second positioning section 5 the stopper pin 23 is provided at the upstream side of the base material in the conveying direction thereof, while the butt pin 25 is provided at the downstream side of the base material with respect to the conveying direction. The base material 10 is slid in the reverse direction with respect to the conveying direction to stop and position the base material.

The reversing section 4 is provided centrally between the first positioning section 3 and the second positioning section 5 along the conveying path, as shown in FIGS. 1 and 2. This reversing section 4 is constructed by arranging a plurality of reversing rollers 27 on the platform 1 in parallel. Each reversing roller 27 has engaging pawls 29, each pawl having a slit 28 provided thereon, and spaced substantially equally along the circumference of the roller 27. The rollers 27 are synchronously rotated in the same direction as the conveying direction of the base material by driving a motor 30. The slit 28 of the pawl 29 engages the base material 10 by conveying the base material so that the forward end portion thereof is conveyed from the first positioning section 3 into the slit 28. Thereafter, the engaged base material is rotated integrally with the rotation of the engaging pawl 29, whereby the face and back of the base material 10 are reversed and the reversed base material is then conveyed to the second positioning section 5.

The masking devices 6 are provided at the first positioning section 3 and the second positioning section 5, respectively. Each masking device 6 comprises a slide base 32 for running along a guide rail 31 provided parallel to the conveying direction of the base material, a slider 34 for sliding vertically a mast 33 integral with the slide base 32, and a head 40 movable in the transverse direction with respect to the slider 34 by a cylinder 35 which is expanded and contracted (by known means not shown) in the direction orthogonal to the conveying direction of the base material.

The head 40 serves to paste a seal 13 on a through hole 12 (FIG. 7) of the base material which does not require plugging, as will be described in more detail later, and is positionable with respect to the through hole 12 in three dimensions. The head is positioned by a combination of the slide base 32 and the slider 34, which are moved in an orthogonal direction to each other, and by the cylinder 35, operating in the direction orthogonal to the slide base 32 and the slider 34. The movement of the slide base 32 and the slider 34 and the expansion and contraction of the cylinder 35 may be controlled by a control box (not shown) which has memorized a given program, so that the head 40 is successively positioned on all through holes 12 of one base material in a desired order.

Figure 4:
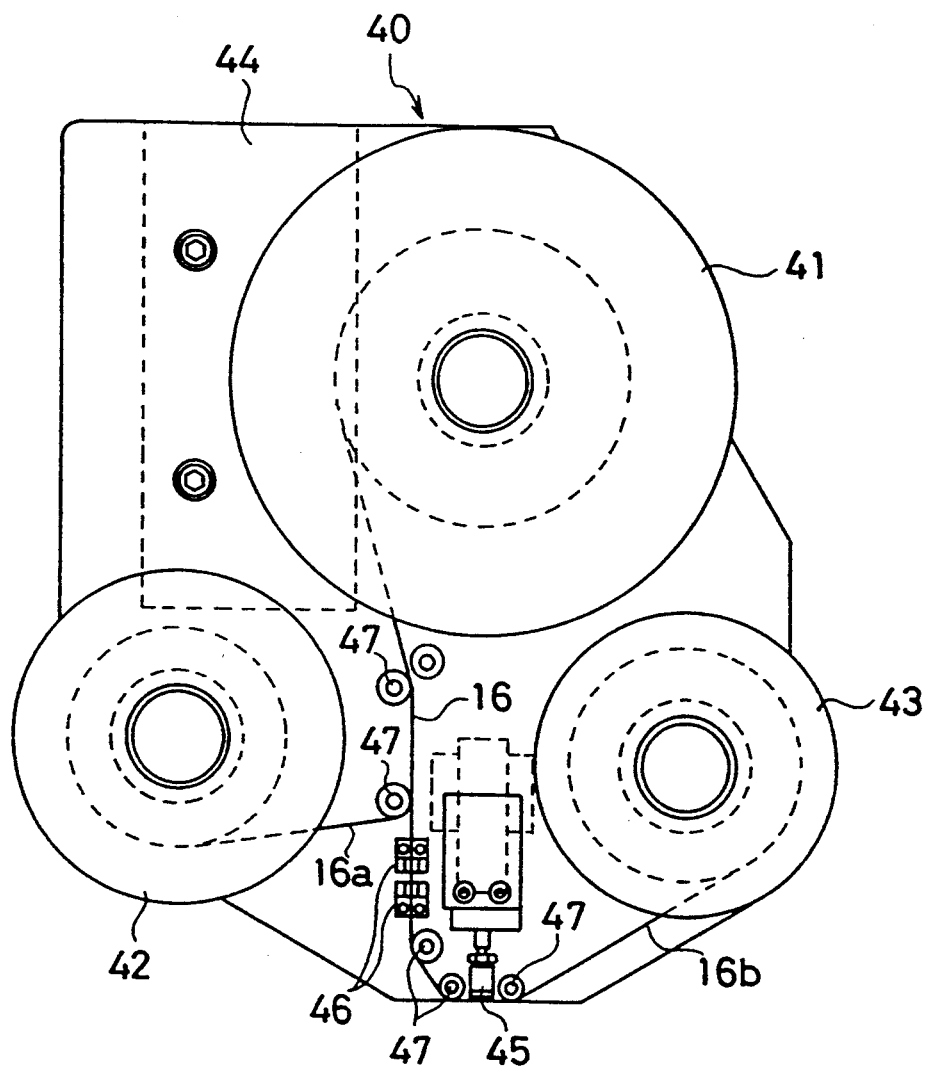
FIG. 4 is a side view showing an embodiment of a head of the masking device for use in a hole masking apparatus according to the present invention.

FIG. 4 shows the head 40 of the masking device 6. The head 40 comprises a supply reel 41 and two take-up reels 42,43 which are mounted rotatably to a bracket 44. Respective reels 41, 42 and 43 are secured to output shafts of respective motors (not shown) to form a supply means for supplying tapes 16 on which are held seals 13, the tape 16 being supplied by driving the motors intermittently and synchronously with respect to each other. The bracket 44 is provided at its lower portion with a hammer 45 which pastes the seal 13 held between tapes 16a and 16b onto the base material. The hammer 45 (the construction of which is not shown in detail) is moved vertically, for example, by a combination of a return spring and an eccentric cam or an actuator such as a cylinder or a solenoid, so that the downward operation of the hammer pushes the seal 13 onto the base material and pastes it thereon.

Figure 5:
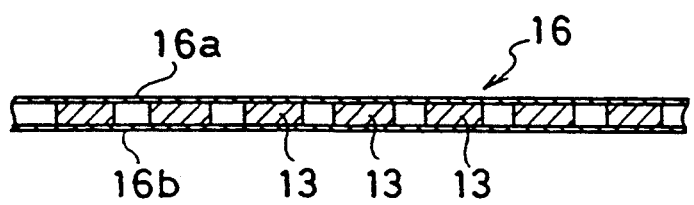
FIG. 5 is a sectional view showing a tape having a seal for use with a hole masking apparatus according to the present invention.

FIG. 5 shows the tape 16 holding the seal 13, in which the seals 13 are sandwiched between upper and lower peeling tapes 16a and 16b at a certain pitch. The supply reel 41 of the head 40 on which tape 16 is wound supplies tape, and the take-up reel 42 peels and takes up one of the peeling papers 16a at the upstream side of the hammer 45. By peeling off the peeling paper 16a, the lower surface of the seal 13 is exposed, and in this condition the seal 13 is pressed on the base material 10 by the hammer 45, so that the seal 13 is pasted or adhered onto the base material and the through hole is masked on this surface of the base material. The other peeling paper 16b, from which the seal 13 is removed, is taken-up onto take-up reel 43.

As regards the seal 13 and the adhesive applied onto the side of the seal 13 adhered to the base material, a watersoluble adhesive, a photo-setting adhesive, or a thermo-setting adhesive may be selected, hereby preventing the rest adhesive in case of peeling of the seal 13 from the base material 10. In FIG. 4, the reference numeral 46 is a sensor for detecting the position of a seal 13 along the tape 16. A signal from the sensor 46 operates the hammer 45. The reference numerals 47 indicate a plurality of guide rollers arranged on the running path of tape 16.

Next, the operation of the hole masking apparatus of one embodiment of the present invention is explained.

In FIGS. 1 and 2, when the base material 10 reaches the first positioning section 3 as moved by the conveyer 7, the butt pin 25 is slid to abut the base material and continues moving, pushing the base material until the stopper pin 23 touches the front end portion of the base material 10, thereby positioning the base material in the same direction as the direction conveyed. The sizing head 26 is slid orthogonally to the conveying direction and thereafter the lock pin 24 is projected and inserted into the dummy hole 14 of the base material 10, thereby positioning the base material 10 in the direction orthogonal to the conveying direction. At the same time, the vacuum table 22 is operated to absorb the base material 10 thereonto. After such a positioning, the seal is adhered to the base material by the masking device 6.

Figure 6:
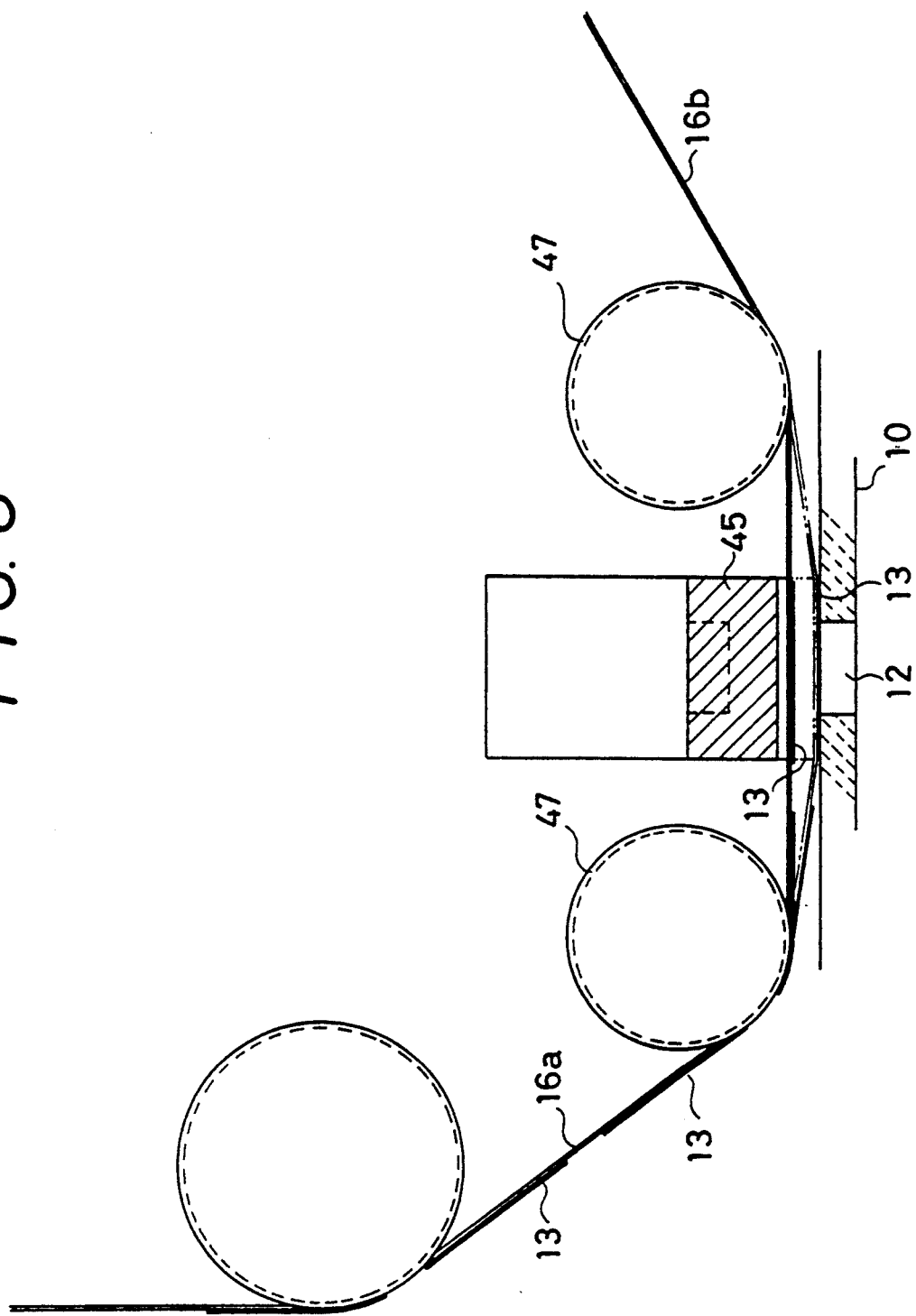
FIG. 6 is a side view showing the operation of a head of a masking device according to this invention.

The masking device 6 is controlled by the control box, in which data such as the size of the base material and the positions and the number of through holes which do not require plugging are memorized, so that the hammer 45 of the head 40 can be positioned above the through hole 12 of the base material 10 to be plugged. FIG. 6 shows the state after the positioning of head 40 is performed. Under such a condition, the hammer 45 is pressed down upon the peeling paper 16b, so that the seal 13, of which the lower surface is exposed, is pressed onto and masks the hole which subsequently will not require plugging. This is shown by the changing of the position of tape 16b from a solid line to a dotted line, whereby the seal 13 is pasted onto the base material 10. Such pastings are performed with respect to all the through holes 12 on one side of the base material 10. After this masking, the base material 10 is discharged from the first positioning section 3 and conveyed under pressure rollers 8. The pressure roller 8 is positioned to press onto the surface of the base material 10 which is pasted by seals 13, thereby assuring that each seal 13 adheres onto the base material 10. The forward end portion of the base material 10 is inserted into and engages the slit 28 of the engaging pawl 29 at the reversing section 4. The reversing roller 27 with the engaged pawl 29 is rotated in the same direction as the conveying direction of the base material 10, so that the rear end portion of the base material 10 is lifted up and rotated through a vertical arc, thereby reversing the face and back sides of the base material. This face and back reversal exposes the back surface of the base material 10, on which no seal is yet pasted. The base material 10 is then conveyed to the second positioning section 5 with its face and back reversed. At the second positioning section 5, the positioning of the base material 10 and the pasting of the seals onto another surface are performed in the same manner as described for the first positioning section 3.

The present invention is not limited to the above described embodiments, and various changes or modifications can be performed. For example, the positioning of the base material may be performed by either or both of the stopper pin 23 and the lock pin 24 at the first positioning section 3 and/or at the second positioning section 5. Moreover, robot hands can be mounted onto the head of the masking device and the seal may be pasted by the robot hands.

What is claimed is:

1. A hole masking apparatus, comprising:
   first and second positioning sections disposed along a conveying path along which a base material is conveyed, said positioning sections being arranged in spaced relation along the conveying path for stopping and positioning the base material, the base material having a plurality of through-holes at respective given positions;
   a masking device disposed at each of the positioning sections and having a movable head for pasting a seal to mask a through-hole in the base material, the head including means for supplying seals to be pasted on through-holes in the base material, and means for moving and positioning the head in such a manner that the head is positioned over through-holes which do not require plugging and which are to be masked with a seal; and
   a reversing section arranged between the first and the second positioning sections for reversing the face and back sides of the base material while the same is conveyed along the conveying path.

2. A hole masking apparatus as claimed in claim 1, further comprising a pressure roller disposed along the conveying path of the base material at the downstream side of each of the respective positioning sections for pressing the seals pasted onto the base material.

3. A hole masking apparatus as claimed in claim 1, wherein the first and the second positioning sections include a stopper pin for engaging and touching a forward end surface of the base material in the conveying direction thereof, and a lock pin insertable into a dummy hole in the base material for registering the base material with the masking device.

4. A hole masking apparatus as claimed in claim 1, wherein the head of the masking device comprises supply means for supplying a tape having a plurality of seals sandwiched between peeling papers at given pitches, means for peeling one of the peeling papers from the tape to expose one side of the seals, and a hammer for pasting the exposed sides of the seals onto the base material.

5. A hole masking apparatus as claimed in claim 1, wherein the reversing section comprises a plurality of engaging pawls each having slits for engaging a forward end portion of the base material such that the face and back of the base material can be reversed by rotating the engaging pawl in the same direction as the conveying direction of the base material.

* * * * *